US012020965B2

(12) United States Patent
Nguyen et al.

(10) Patent No.: US 12,020,965 B2
(45) Date of Patent: Jun. 25, 2024

(54) MAGNETIC HOLDING STRUCTURES FOR PLASMA PROCESSING APPLICATIONS

(71) Applicant: Applied Materials, Inc., Santa Clara, CA (US)

(72) Inventors: Andrew Nguyen, San Jose, CA (US); Sathya Swaroop Ganta, Sunnyvale, CA (US); Kallol Bera, Fremont, CA (US); Canfeng Lai, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 302 days.

(21) Appl. No.: 17/076,024

(22) Filed: Oct. 21, 2020

(65) Prior Publication Data

US 2022/0122866 A1 Apr. 21, 2022

(51) Int. Cl.
*C23C 16/00* (2006.01)
*C23C 16/513* (2006.01)
(Continued)

(52) U.S. Cl.
CPC ...... *H01L 21/67709* (2013.01); *C23C 16/513* (2013.01); *H01J 37/3266* (2013.01); *H01L 21/02274* (2013.01)

(58) Field of Classification Search
None
See application file for complete search history.

(56) References Cited

U.S. PATENT DOCUMENTS 5,660,744 A * 8/1997 Sekine ............... H01J 37/3266
204/298.37

6,014,943 A * 1/2000 Arami ............... H01J 37/32082
156/345.46
(Continued)

FOREIGN PATENT DOCUMENTS

JP     2001156044 A    6/2001
KR     20030005241 A   1/2003
WO     2016018505 A1   2/2016

OTHER PUBLICATIONS

International Search Report and Written Opinion dated Jan. 26, 2022 for Application No. PCT/US2021/053835.
(Continued)

*Primary Examiner* — Sylvia MacArthur
*Assistant Examiner* — Michelle Crowell
(74) *Attorney, Agent, or Firm* — Patterson & Sheridan LLP

(57) ABSTRACT

Embodiments of the present disclosure generally relate to semiconductor processing equipment, and more specifically to apparatus, e.g., magnet holding structures, that can be used with magnets during plasma processing of a substrate. In an embodiment, a magnet holding structure for a plasma-enhanced chemical vapor deposition chamber is provided. The magnet holding structure includes a top piece having a plurality of magnet retention members and a bottom piece having a plurality of magnet retention members. The top piece has a first inside edge and a first outside edge, and the bottom piece has a second inside edge and a second outside edge. The magnet holding structure further includes a plurality of casings. Each casing of the plurality of casings is configured to at least partially encapsulate a magnet, and each casing positioned between a magnet retention member of the top piece and a magnet retention member of the bottom piece.

10 Claims, 9 Drawing Sheets

(51) Int. Cl.
*H01J 37/32* (2006.01)
*H01L 21/00* (2006.01)
*H01L 21/02* (2006.01)
*H01L 21/677* (2006.01)

(56) References Cited

U.S. PATENT DOCUMENTS

| | | | |
|---|---|---|---|
| 6,245,190 B1 * | 6/2001 | Masuda | H01J 37/32678 |
| | | | 156/345.46 |
| 6,436,230 B1 | 8/2002 | Kondo et al. | |
| 7,294,224 B2 * | 11/2007 | Vesci | H01J 37/3266 |
| | | | 156/345.46 |
| 9,754,771 B2 * | 9/2017 | West | H01J 37/3405 |
| 9,991,101 B2 * | 6/2018 | Johanson | C23C 14/35 |
| 2001/0032591 A1 | 10/2001 | Carducci et al. | |
| 2004/0035692 A1 | 2/2004 | Ding et al. | |
| 2004/0045934 A1 | 3/2004 | Harvey et al. | |
| 2005/0116392 A1 * | 6/2005 | Vesci | H01J 37/3408 |
| | | | 310/156.28 |
| 2005/0279624 A1 | 12/2005 | Brcka | |
| 2008/0277063 A1 * | 11/2008 | Shin | H01J 37/3266 |
| | | | 118/723 R |
| 2009/0218218 A1 | 9/2009 | Kutsuzawa et al. | |
| 2010/0024983 A1 | 2/2010 | Honda et al. | |
| 2011/0311735 A1 * | 12/2011 | Wang | H01J 37/3408 |
| | | | 427/571 |
| 2013/0010454 A1 | 1/2013 | Takayama et al. | |
| 2016/0163511 A1 | 6/2016 | Nguyen et al. | |
| 2016/0293389 A1 | 10/2016 | Chen et al. | |
| 2017/0040140 A1 | 2/2017 | Tanaka et al. | |
| 2019/0244754 A1 * | 8/2019 | Yang | H01J 37/3452 |
| 2020/0144029 A1 * | 5/2020 | Gandikota | H01J 37/32715 |
| 2021/0050189 A1 * | 2/2021 | Gottheim | H01J 37/32669 |

OTHER PUBLICATIONS

International Search Report/ Written Opinion issued to PCT/US2019/059344 on Feb. 24, 2020.
International Search Report/ Written Opinion issued to PCT/US2020/046470 on Nov. 23, 2020.

* cited by examiner

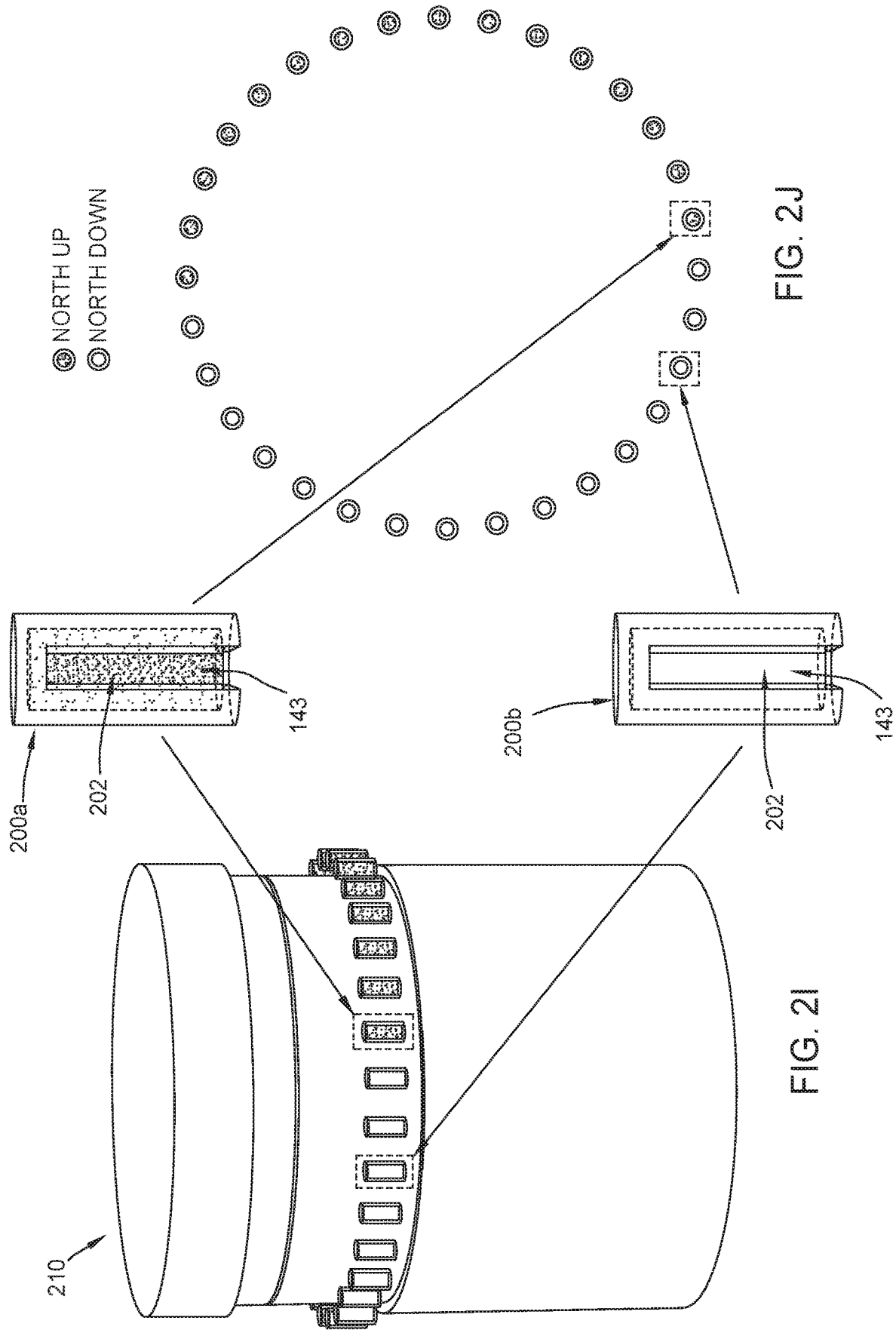

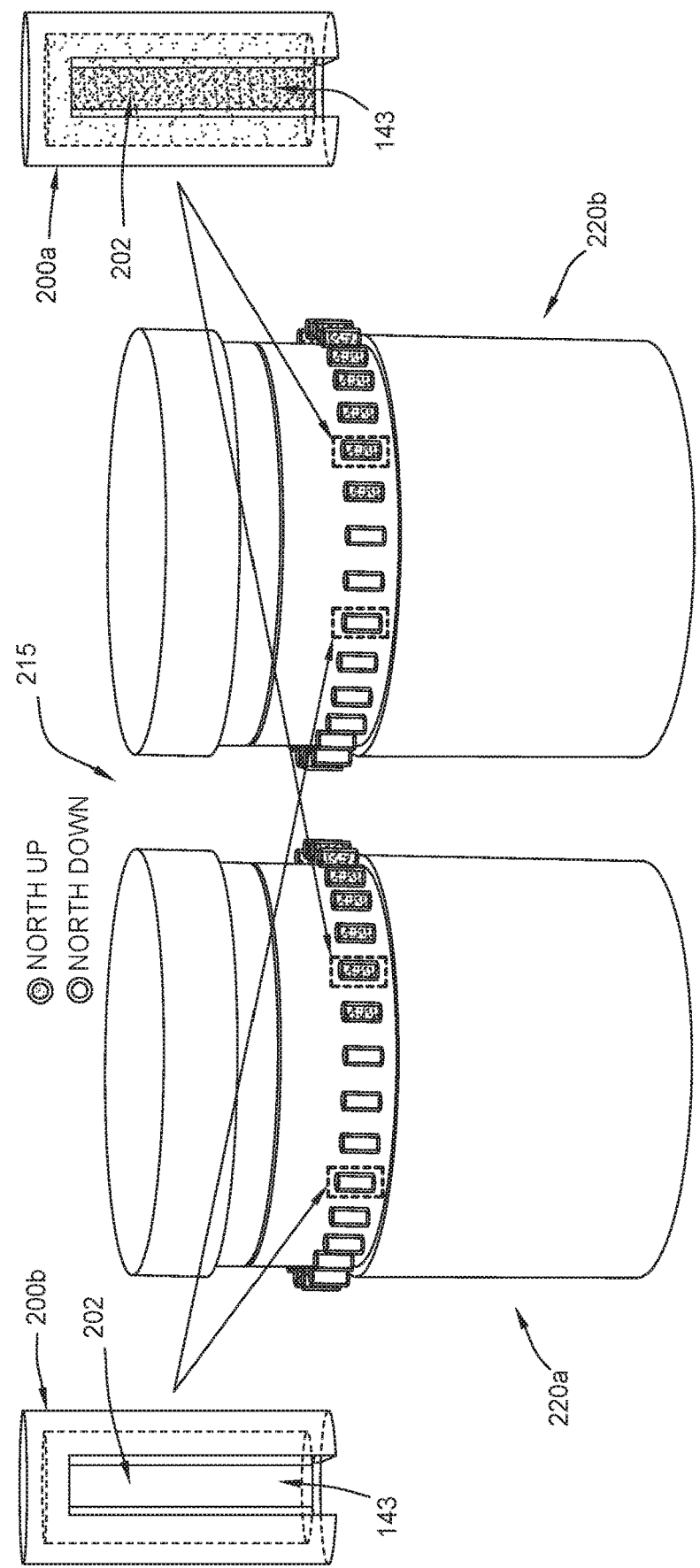

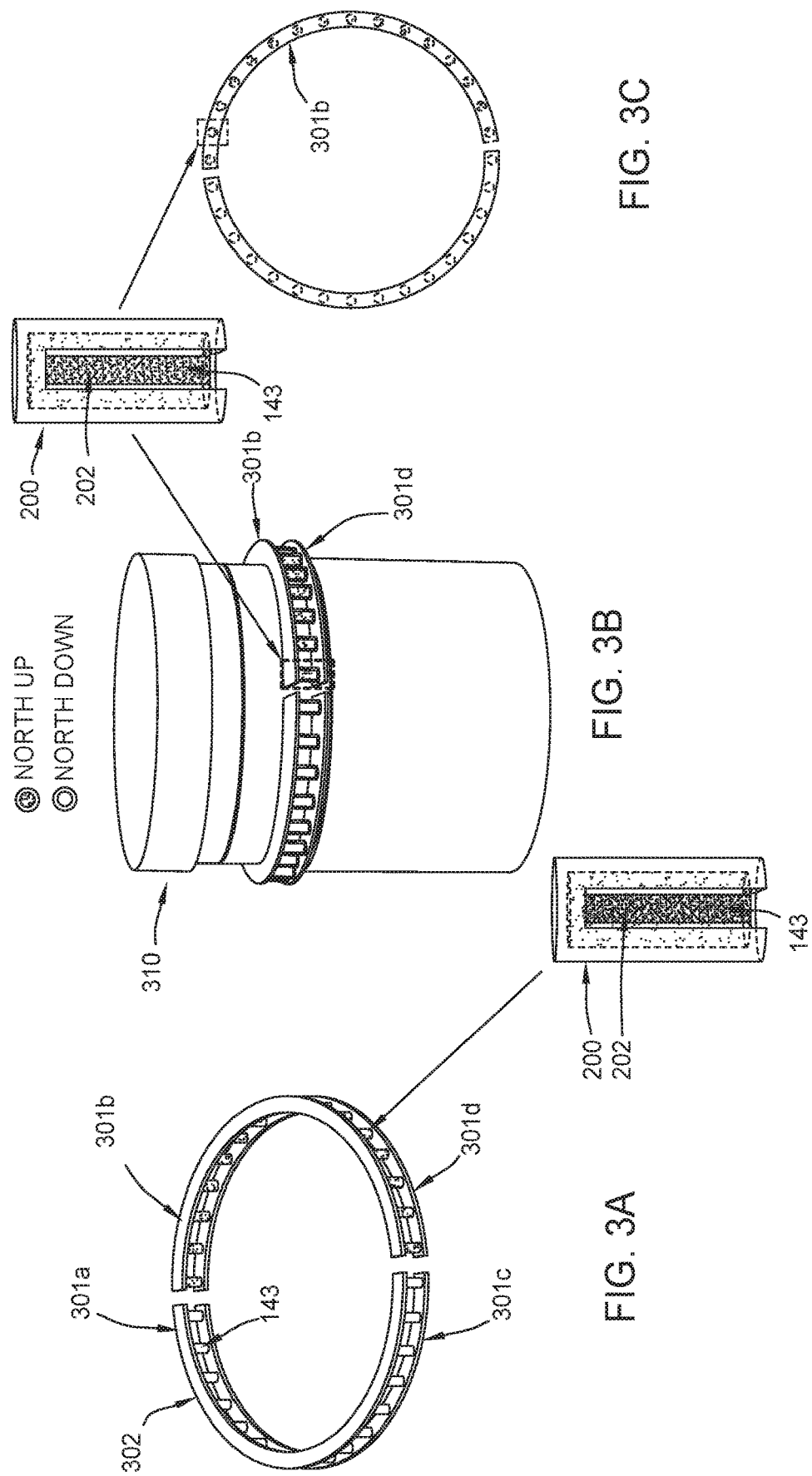

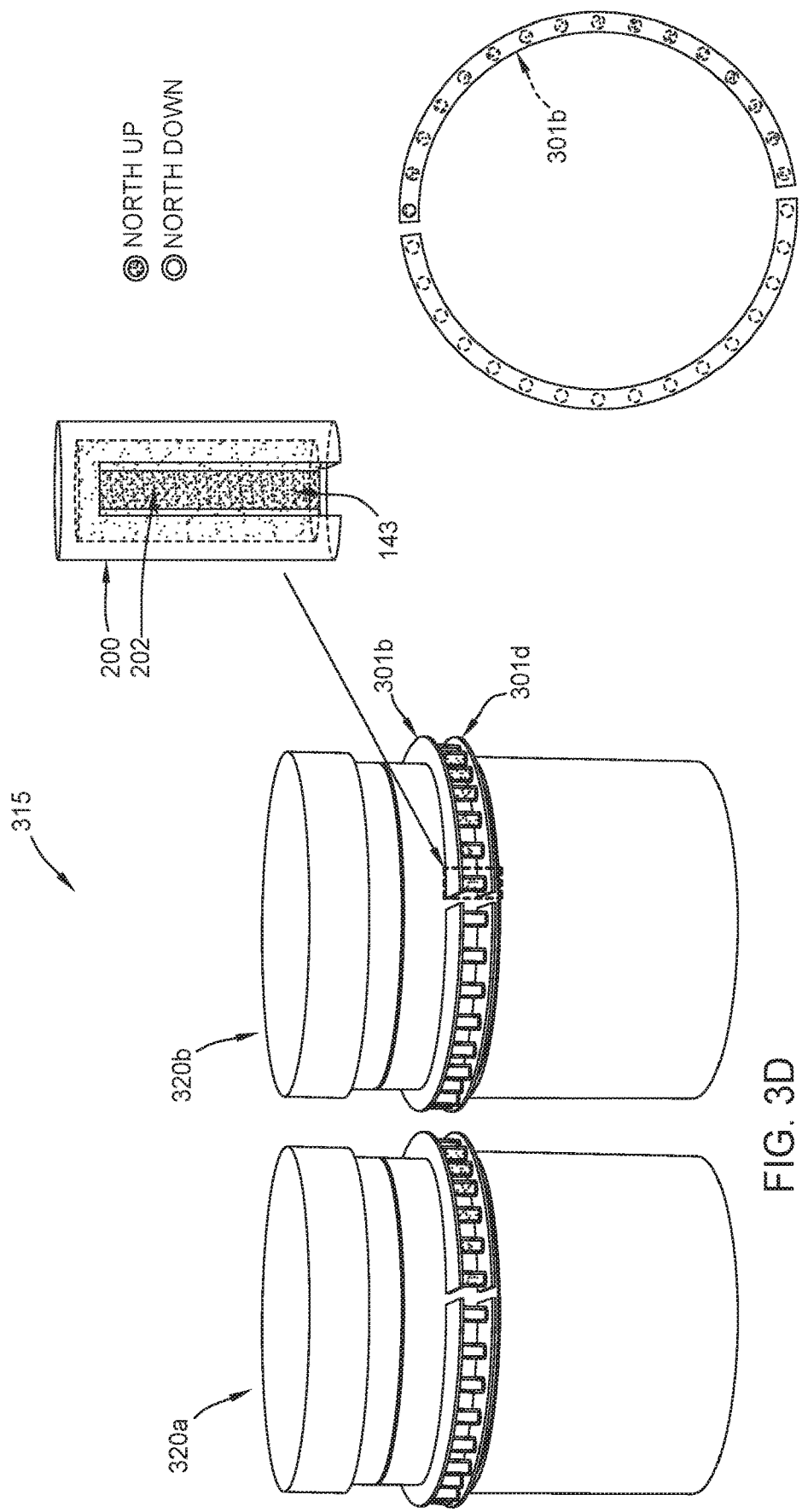

MAGNETIC HOLDING STRUCTURES FOR PLASMA PROCESSING APPLICATIONS

BACKGROUND

Field

Embodiments of the present disclosure generally relate to semiconductor processing equipment, and more specifically to apparatus, e.g., magnet holding structures, that can be used with magnets during plasma processing of a substrate.

Description of the Related Art

In plasma processing of a substrate, such as plasma enhanced chemical vapor deposition (PECVD), magnets and magnet assemblies are used to modulate the plasma density profile and enhance the average plasma density through confinement of the plasma. The magnetic fields generated by the magnets and magnetic assemblies permit control over, e.g., the uniformity of deposition and the deposition rate of materials. Conventionally, and in order to shield the magnetic field from sensitive equipment exterior to the chamber, the magnets and magnetic assemblies are housed in large shields or chamber-sized walls made of high permeability materials that shield magnetic field. Although such housings can provide some control over the magnitude and direction of the magnetic field, such shields occupy a large space, add unnecessary weight to the chamber, and pose challenges in their implementation. Such challenges include the requirement of making holes or windows in the shield walls to accommodate moving parts which defeats the purpose of shielding in the first place. Besides, such holes or windows can cause undesirable on-wafer process non-uniformity.

Moreover, the shielding of conventional housings can create excessive plasma density enhancement inside the chamber, causing destructive sputtering of metal atoms from chamber walls and contaminating the substrate or equipment in the chamber. Such excessive plasma density enhancement can also lead to flaky deposition on the walls. The flakily deposited low-quality films detach and fall back into the plasma during process. The detached films pick up charge as they fall through the plasma and are suspended in the plasma due to high bias potential developed during processing. When the RF power is turned off during processing or at the end of processing, these films can fall on the substrate and since they are of low quality, they form defects in the deposited layer on wafer, thereby weakening deposition quality.

There is a need for improved apparatus that overcome one or more deficiencies of conventional apparatus.

SUMMARY

Embodiments of the present disclosure generally relate to semiconductor processing equipment, and more specifically to apparatus, e.g., magnet holding structures, that can be used with magnets during plasma processing of a substrate.

In an embodiment, a magnet holding structure for a plasma-enhanced chemical vapor deposition chamber is provided. The magnet holding structure includes a top piece having a plurality of magnet retention members. The top piece has a first inside edge and a first outside edge. The magnet holding structure further includes a bottom piece having a plurality of magnet retention members. The bottom piece has a second inside edge and a second outside edge. The magnet holding structure further includes a plurality of casings. Each casing of the plurality of casings is configured to at least partially encapsulate a magnet, and each casing is positioned between a magnet retention member of the top piece and a magnet retention member of the bottom piece.

In another embodiment, a magnet holding structure for a plasma-enhanced chemical vapor deposition chamber is provided. The magnet holding structure includes a top piece having a plurality of magnet retention members and a bottom piece having a plurality of magnet retention members. The top piece has a first inside edge and a first outside edge, and the bottom piece has a second inside edge and a second outside edge. The magnet holding structure further includes a plurality of casings. Each casing of the plurality of casings is configured to at least partially encapsulate a magnet, and each casing is positioned between a magnet retention member of the top piece and a magnet retention member of the bottom piece. One or more casings of the plurality of casings is made of a material having a relative magnetic permeability value of 80,000 or greater.

In another embodiment, a chamber for processing a substrate is provided. The chamber includes a chamber body and a rotational magnetic housing system having a rotational magnetic housing coupled to the chamber. The rotational magnetic housing includes an upper plate, an outer sidewall, an inner sidewall defining a round central opening, a lower plate, a plurality of casings having a plurality of magnets removably disposed therein, a plurality of retaining brackets disposed in the rotational magnetic housing, and a magnet holding structure. The magnet holding structure includes a plurality of casings. Each casing of the plurality of casings is configured to at least partially encapsulate a magnet, and the plurality of retaining brackets have the plurality of casings removably disposed therein. Each casing of the plurality of casings is retained in a respective retaining bracket with a pitch p between each casing of the plurality of magnets.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2I is a perspective view of example magnets with individual casings surrounding a single plasma chamber according to at least one embodiment of the present disclosure.

FIG. 2J is a top view, corresponding to FIG. 2I, showing magnet polarities according to at least one embodiment of the present disclosure.

FIG. 2K is a perspective view of example magnets with individual casings surrounding each of two plasma chambers according to at least one embodiment of the present disclosure.

FIG. 3A is a perspective view of example cap(s) according to at least one embodiment of the present disclosure.

FIG. 3B is a perspective view of example cap(s) surrounding a single plasma chamber according to at least one embodiment of the present disclosure.

FIG. 3C is a top view, corresponding to FIG. 3B, showing magnet polarities according to at least one embodiment of the present disclosure.

FIG. 3D is a perspective view of magnets disposed within example cap(s) surrounding each of two plasma chambers according to at least one embodiment of the present disclosure To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to semiconductor processing equipment, and more specifically to apparatus, e.g., magnet holding structures, that can be used with magnets during plasma processing of a substrate. The magnet holding structures, e.g., casings and caps, can be used to at least partially cover permanent magnets used in or around plasma chambers, in, e.g., low-pressure plasma applications. Briefly, and in some examples, the magnet holding structure is a casing for a magnet. At least a portion of the casing can be made of a high magnetic permeability material and include an opening, e.g., a slot. When the casing is used with a magnet, the casing can enable attenuation of the magnetic-field strength around the magnet. In use, then, the opening of the casing can face the plasma chamber. In some examples, the magnet holding structure is a cap or a piece to hold a plurality of magnets with or without casings. The cap can be made of a magnetic or nonmagnetic material. When the cap is made of a magnetic material, the magnetic material can have relatively low magnetic permeability in order to let the magnetic field pass through the cap. In some examples, the magnet holding structure includes both casing(s) and cap(s). Each cap holds one or more magnets, with or without casings. When the cap is made of a magnetic material, the cap can unite the field from the magnet(s) that it holds and can direct the magnetic field towards the plasma chamber.

In contrast to conventional shields that control the strength and direction of the magnetic field, the magnet holding structures described herein—e.g., casing, cap, or combinations thereof—occupies a significantly less amount of space, e.g., not much more space than the magnets themselves. Despite having this smaller spatial footprint and weight, the improved apparatus provides similar functionality of attenuating the magnetic field strength in all directions. That is, when the casing openings face the substrate processing chamber, the magnetic field is not attenuated (or less attenuated) in the direction toward the chamber.

Due to the smaller size and weight of the apparatus described herein, the apparatus described herein is implemented more easily relative to conventional shields. Moreover, when using the apparatus described herein, the magnetic field created by the magnets is forcibly directed towards the corresponding substrate processing chamber using the openings in the apparatus, thereby attenuating magnetic field strength in all other directions. Furthermore, the apparatus described herein can advantageously weaken the magnetic field coupled to the chamber, thereby avoiding excessive plasma density enhancement that affects, e.g., wafer quality.

Figure 1A:
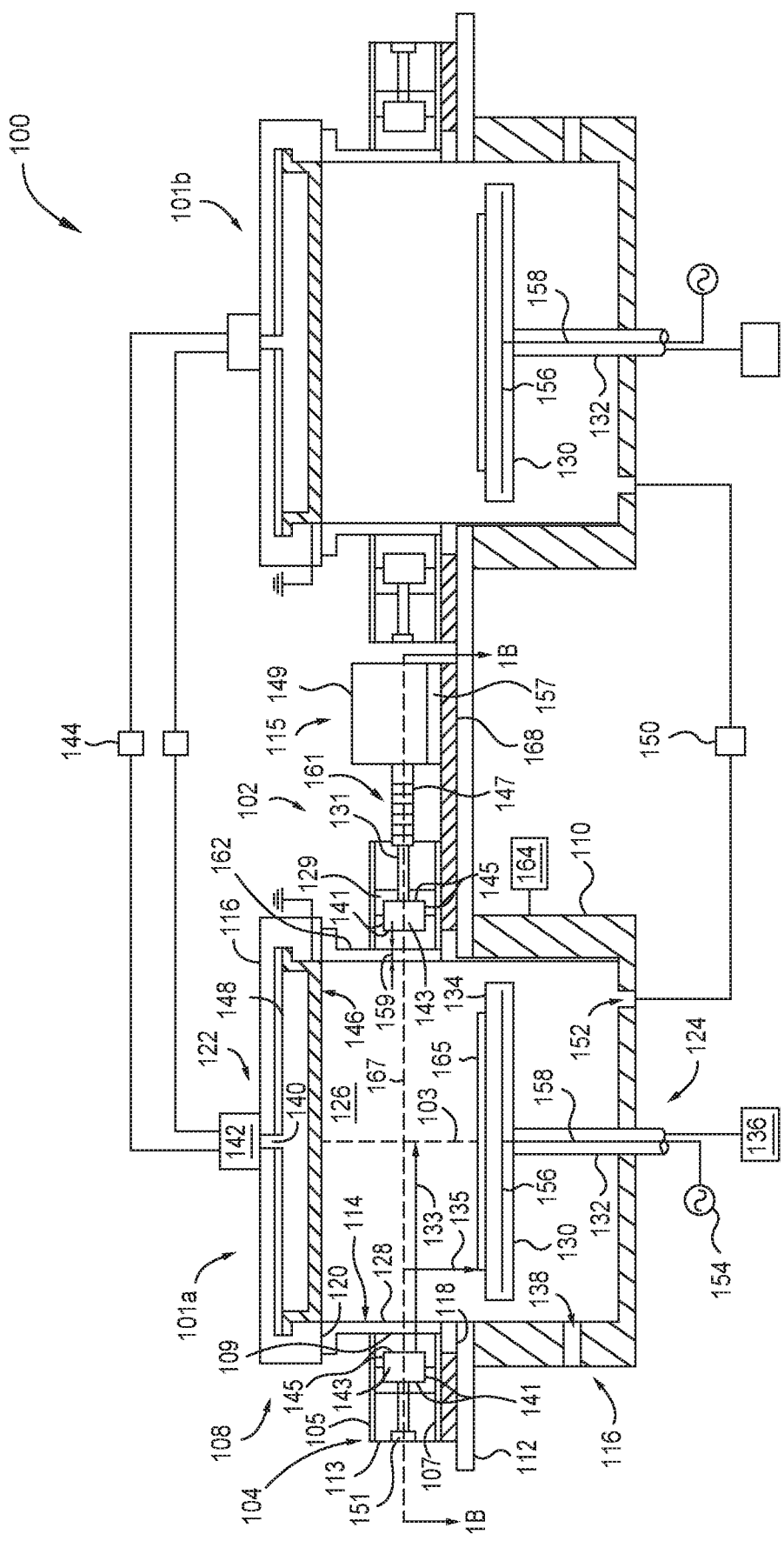
FIG. 1A is a schematic cross-sectional view of a plasma-enhanced chemical vapor deposition (PECVD) chamber according to at least one embodiment of the present disclosure.

FIG. 1A is a schematic cross-sectional view of an example plasma-enhanced chemical vapor deposition (PECVD) system 100 according to at least one embodiment of the present disclosure. One non-limiting example of the system 100 is a PRODUCER® system manufactured by Applied Materials, Inc., located in Santa Clara, Calif. It is to be understood that the system described below is an exemplary chamber and other systems, including systems from other manufacturers, may be used with or modified to accomplish aspects of the present disclosure. The system 100 includes a chamber 101a (e.g., first chamber) and a chamber 101b (e.g., second chamber). In some embodiments, the chambers 101a, 101b share resources. For example, the chambers 101a, 101b can share at least one or more gas sources 144, a mounting plate 112, and a pump 150. The chambers 101a, 101b are similarly configured. However, it is also contemplated that each of chambers 101a, 101b have dedicated resources.

Each chamber 101a, 101b has a rotational magnetic housing system 102 with a rotational magnetic housing 104 disposed outside of the chamber 101a, 101b. It is also contemplated that instead of a rotational magnetic housing system 102 with a rotational magnetic housing 104, each chamber 101a, 101b has an electromagnet housing system with an electromagnet housing disposed outside of the chamber 101a, 101b. Alternatively, each chamber 101a, 101b has an electromagnet system disposed in a spacer 114 of a chamber lid assembly 108. While aspects of chamber 101a are discussed, it is to be understood that chamber 101b is similarly equipped. Reference numerals may be omitted on chamber 101b for clarity in FIG. 1A.

Each chamber 101a, 101b has a chamber body assembly 106 and a chamber lid assembly 108. The chamber body assembly 106 includes a chamber body 110 coupled to the mounting plate 112. The chamber lid assembly 108 includes the spacer 114 having a first flange 118 coupled to the mounting plate 112 and a chamber lid 116 coupled to a second flange 120 of the spacer 114. The chamber lid 116 includes a gas distribution assembly 122. The gas distribution assembly 122 is positioned opposite a substrate support assembly 124 defining a process volume 126 therebetween. The process volume 126 is further defined by the chamber lid 116, an interior side 128 of the spacer 114, the mounting plate 112, and the chamber body 110.

The substrate support assembly 124 is disposed within the process volume 126. The substrate support assembly 124 includes a substrate support 130 and a stem 132. The substrate support 130 has a support surface 134 for supporting a substrate 165. The substrate support 130 typically includes a heating element (not shown). The substrate support 130 is movably disposed in the process volume 126 by the stem 132 which extends through the chamber body 110 where the stem 132 is connected to a substrate support drive system 136. The substrate support drive system 136 moves the substrate support 130 between an elevated processing position (as shown) and a lowered position that facilitates substrate transfer to and from the process volume 126 through a slit valve 138 formed though the chamber body 110. In at least one embodiment, the substrate support drive system 136 rotates the stem 132 and the substrate support 130. In at least one embodiment, the gas distribution assembly 122 is configured to distribute gases uniformly into the process volume 126 of the chamber 101a, 101b to facilitate deposition of a film, such as an advanced patterning film, on the substrate 165 positioned on the substrate support 130 of the substrate support assembly 124. Additionally, or alternatively, the gas distribution assembly 122 is configured to distribute gases uniformly into the process volume 126 of the chamber 101a, 101b to facilitate etching of a film, such as an advanced patterning film, disposed on the substrate 165 positioned on the substrate support 130 of the substrate support assembly 124.

The gas distribution assembly 122 includes a gas inlet passage 140, which delivers gases from a flow controller 142 coupled to one or more gas sources 144 through a diffuser 146 suspended from a hanger plate 148. The diffuser 146 includes a plurality of holes or nozzles (not shown) through which gaseous mixtures are injected into the process volume 126 during processing. The pump 150 is coupled to an outlet 152 of the chamber body 110 for controlling the pressure within the process volume 126 and exhausting byproducts from the process volume 126. The diffuser 146 of gas distribution assembly 122 can be connected to an RF return (or ground) allowing RF energy applied to the substrate support 130 to generate an electric field within the process volume 126, which is used to generate the plasma for processing of the substrate 165.

A RF source 154 is coupled to an electrode 156 disposed within the substrate support 130 through a conductive rod 158 disposed through the stem 132. In at least one embodiment, the electrode 156 is connected to the RF source 154 through a match box 163 having a match circuit for adjusting and a sensor for measuring electrical characteristics, such as voltage, current, and/or impedance, of the electrode 156. The match circuit may facilitate adjustment of voltage, current, or impedance in response to a signal from the sensor. The diffuser 146 of gas distribution assembly 122, which is connected to an RF return, and the electrode 156 facilitate formation of a capacitive plasma coupling. The RF source 154 provides RF energy to the substrate support 130 to facilitate generation of a capacitive coupled plasma between the substrate support 130 and the diffuser 146 of the gas distribution assembly 122. When RF power is supplied to the electrode 156, an electric filed is generated between the diffuser 146 and the substrate support 130 such that atoms of gases present in the process volume 126 between the substrate support 130 and the diffuser 146 are ionized and release electrons. The ionized atoms accelerated to the substrate support 130 facilitate deposition or etching of the film the substrate 165 positioned on the substrate support 130.

Rotational speed of the magnets, strength of the magnets (Gauss), and vertical position of the magnets can be adjusted to facilitate a corresponding adjustment in the density profile of the plasma. For example, adjustments can be made to one or more of vertical position of a plasma relative to a substrate, peak position of the density profile, or the value of the ion density at a particular location relative to a substrate.

As shown in FIG. 1A, a controller 164 coupled to the chamber 101a, 101b and the rotational magnetic housing system 102 is configured to control aspects of the chamber 101a, 101b and the rotational magnetic housing system 102 during processing.

Figure 1B:
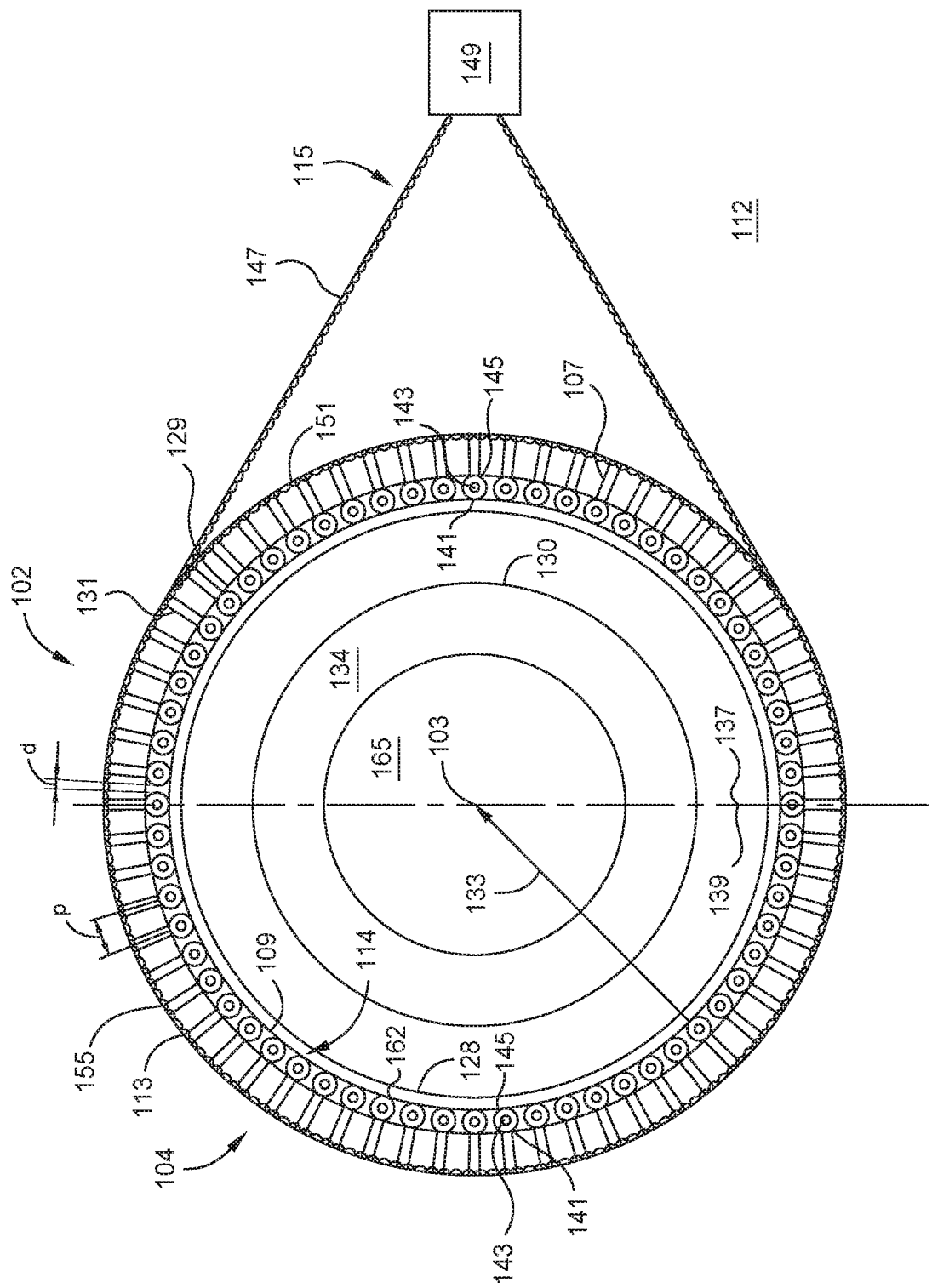
FIG. 1B is a schematic top view of a rotational magnetic housing system according to at least one embodiment of the present disclosure.

FIG. 1B illustrates a schematic top view of the rotational magnetic housing system 102 according to at least one embodiment of the present disclosure. Referring to FIG. 1A and FIG. 1B, the rotational magnetic housing system 102 includes the rotational magnetic housing 104 configured to rotate about a center axis 103 of the process volume 126 to create static or dynamic magnetic fields. The magnetic fields modify the shape of the plasma, concentration of ions and radicals, and movement of concentration of ions and radicals to control the density profile of the plasma within the process volume 126. The rotational magnetic housing system 102 with the rotational magnetic housing 104 is disposed outside of the chamber 101a, 101b. The rotational magnetic housing system 102 includes an upper plate 105, a lower plate 107 disposed opposite to the upper plate 105, an inner sidewall 109, an outer sidewall 113 disposed opposite the inner sidewall 109, a housing lift system 168, and a housing drive system 115. The interior side 128 defines a round central opening. In some embodiments, at least one of the upper plate 105, lower plate 107, and spacer 114 includes one or more channels (not shown) connected to a heat exchanger (not shown) to control a temperature profile of the rotational magnetic housing 104. An exterior wall 162 of the spacer 114 includes a polymer material, such as PTFE (polytetrafluoroethylene). In at least one embodiment, the exterior wall 162 is a sheet of polymer material. The polymer material of the exterior wall 162 of the spacer 114 allows the rotational magnetic housing 104 to rotate around the spacer 114 about the center axis 103 of the process volume 126.

The rotational magnetic housing 104 includes a plurality of retaining brackets 129. Each retaining bracket of the plurality of retaining brackets 129 is disposed in the rotational magnetic housing 104 with a distance d between each retaining bracket 129. The plurality of retaining brackets 129 enables a plurality of magnets 143 to be disposed in or removed from the rotational magnetic housing 104. In at least one embodiment, each magnet 143 of the plurality of magnets 143 is retained in a retaining bracket 129 with a pitch p between each magnet 143 of the plurality of magnets 143. The pitch p corresponds to a distance between each adjacent magnet 143 of the plurality of magnets 143. The pitch p tunes the magnetic fields generated by rotating the rotational magnetic housing 104. In at least one embodiment, each of the retaining brackets 129 is coupled to tracks 131. The retaining brackets 129 are actuated such that each of the retaining brackets 129 are operable to slide along the tracks 131 in a radial direction to vary a horizontal distance 133 from each of the magnets 143 to the center axis 103 of the process volume 126.

In some embodiments, and as shown in FIG. 1B, a first half 137 (e.g., encompassing about 180 degrees) of the rotational magnetic housing 104 has the magnets 143 with the north pole 141 oriented toward the process volume 126 and second half 139 (e.g., encompassing about 180 degrees) of the rotational magnetic housing 104 has the magnets 143 with the south pole 145 oriented toward the process volume 126. The rotational magnetic housing 104 is coupled to the housing drive system 115. The housing drive system 115 includes a belt 147 and a motor 149. The rotational magnetic housing 104 includes a plurality of grooves 151 formed in an outer sidewall 113 of the rotational magnetic housing 104. Each groove of the plurality of grooves 151 corresponds to a lug 155 of a plurality of lugs 155 of the belt 161. The belt 161 is configured to be disposed around the rotational magnetic housing 104 and is coupled to the motor 149, such as a brushless DC electric motor. The housing drive system 115 is configured to rotate the rotational magnetic housing 104 about the center axis 103 of the process volume 126 at a rotation rate. The rotation rate controls a current of the substrate 165 resulting from the modified magnetic fields. In one example, it is contemplated that each of chambers 101a, 101b includes individual housing drive systems 115. In another example, it is contemplated that each of chambers 101a, 101b share a housing drive system 115.

As described below, the magnet holding structures, such as casings and/or caps, can be utilized with the magnets 143. The casings, which have one or more openings, are disposed over at least a portion of the magnet 143. The casings, which can be made of, e.g., a high magnetic permeability material, can trap magnetic field within their wall and reduce the field strength outside the magnet in all directions. The openings are directed towards the plasma chamber and allow enough coupling of magnetic field into the chamber. The caps can be configured to receive one or more magnets 143 (with or without casings). The casings and/or caps can also entrap within them any magnetic field incident from outside preventing the outside field from altering the plasma within the chamber. Any magnetic field that falls on the casing(s) and/or cap(s) becomes trapped within the material of the casing(s) and/or cap(s). For example, a casing traps within its material the magnetic field coming out of the magnet located within the hollow of that casing and simultaneously, the same casing also traps within its material the stray magnetic field falling on it that comes out of magnets that are placed within casings surrounding an adjacent chamber. The attenuation of field strength outside the casing(s) and/or cap(s) also improves safety conditions.

Casings

Embodiments of the present disclosure generally relate to magnet holding structures, such as casings, for individual magnets. The casing can be disposed over at least a portion of an individual magnet; that is, the casing at least partially encapsulates/houses an individual magnet. By utilizing the casing described herein, a user is provided control over, e.g., the strength and magnitude of the magnetic field that is coupled into the chamber. Moreover, the casing permits control over the strength and magnitude of magnetic field cross-talk when two chambers are used in a system for processing a substrate.

Figure 2B:
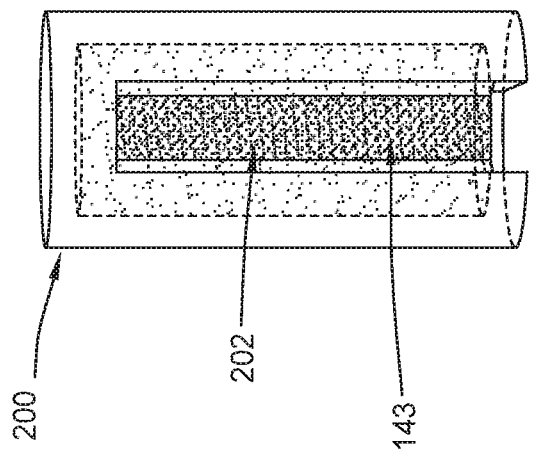
FIG. 2B is an example casing with a magnet according to at least one embodiment of the present disclosure.
Figure 2A:
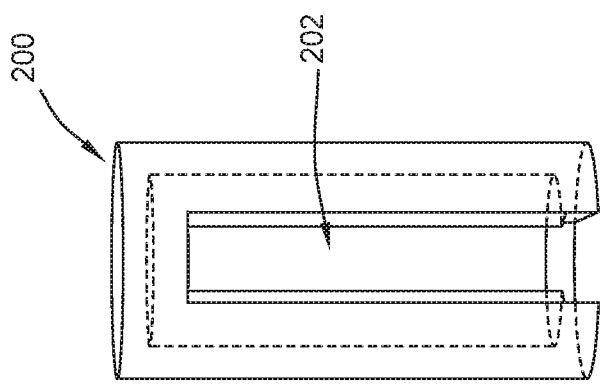
FIG. 2A is an example casing according to at least one embodiment of the present disclosure.
Figure 2E:
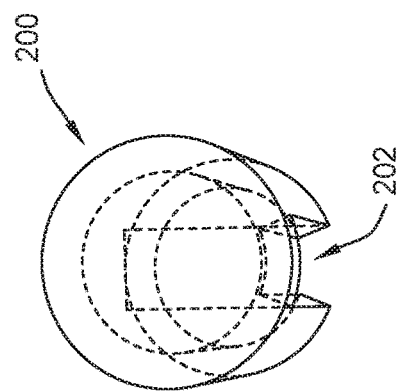
FIG. 2E is a top view of the example casing of FIG. 2A according to at least one embodiment of the present disclosure.
Figure 2D:
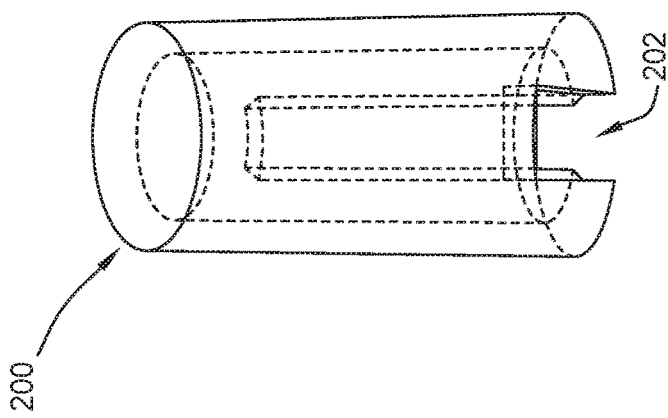
FIG. 2D is a back view of the example casing of FIG. 2A according to at least one embodiment of the present disclosure.
Figure 2C:
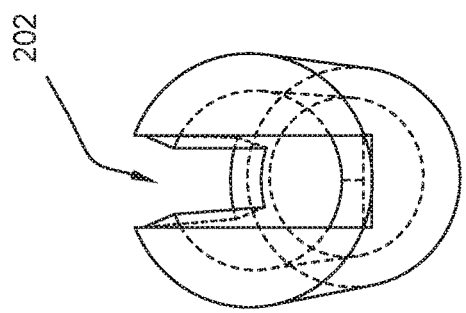
FIG. 2C is a bottom view of the example casing of FIG. 2A according to at least one embodiment of the present disclosure.
Figure 2H:
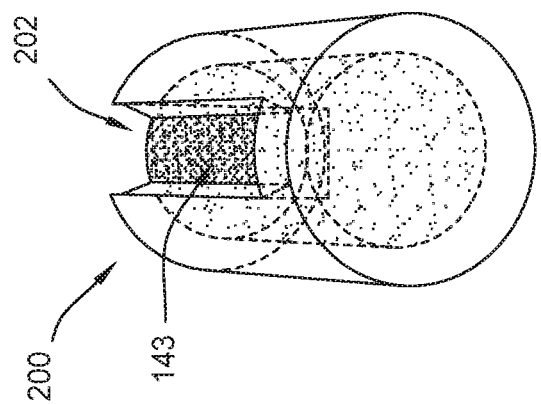
FIG. 2H is a top view of the example casing with a magnet of FIG. 2B with the north pole of the magnet facing up according to at least one embodiment of the present disclosure.
Figure 2G:
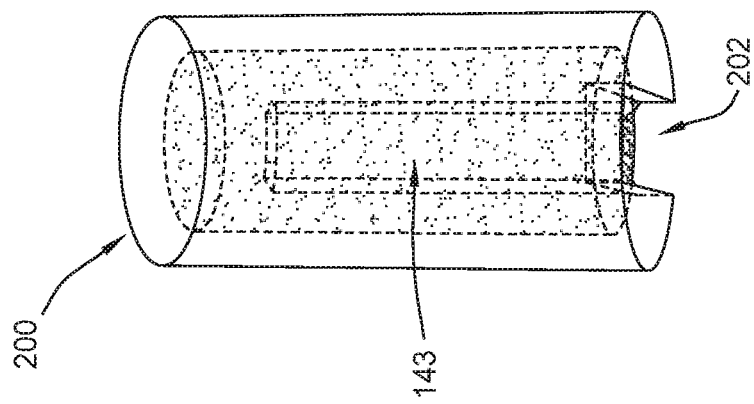
FIG. 2G is a back view of the example casing with a magnet of FIG. 2B with the north pole of the magnet facing up according to at least one embodiment of the present disclosure.
Figure 2F:
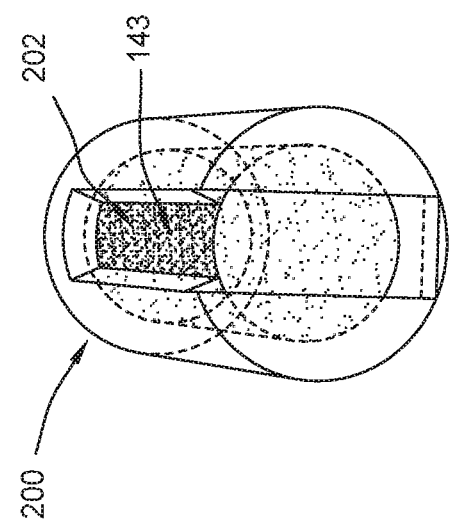
FIG. 2F is a bottom view of the example casing with a magnet of FIG. 2B with the north pole of the magnet facing up according to at least one embodiment of the present disclosure.

FIG. 2A is an example of a casing 200 according to at least one embodiment of the present disclosure. The casing 200 can be used with, one or more magnets, e.g., magnet 143, as shown in FIG. 2B. FIGS. 2C-2E are various views of the example casing 200 of FIG. 2A, and FIGS. 2F-2H are various views of the example casing 200 with the magnet 143 shown in FIG. 2B. The casing 200 includes an opening 202, such as a slot, where at least a portion of the magnet 143 is exposed. As an example, the casing 200 has a narrow slot on the side that extends to the bottom of the casing 200 such that the casing 200 at least partially encapsulates the magnet 143.

The casing 200 has tunable parameters that provide control over how much magnetic field is coupled into the chamber. Such tunable parameters include, e.g., the magnetic permeability of the material used to make the casing; the size and thickness of each casing; the position of the opening(s) of each casing; and/or the rotation of the casing such that magnetic north of the magnet faces up or down. The magnetic field starts from the north pole of the magnet and ends at the south pole of the magnet forming a loop. When, for example, half of the magnets surrounding a chamber have their north side up, the magnetic field starts there and when the other half of magnets have their north side down, e.g., south side up, the magnetic field ends there. Thus, the magnetic field goes from one side of a chamber to the other side, passing through the inside of the chamber. When, for example, all magnets are north side up or all are north side down, such a phenomenon will not happen and the magnetic field will not pass through the inside of the chamber.

The casing 200 can be made of a magnetic material, a nonmagnetic material, or a combination thereof. Additionally, or alternatively, the casing 200 can be made of a high magnetic permeability material, such as a metal, metal alloy, or combinations thereof. The metals and/or metal alloys can be ferromagnetic having high relative magnetic permeability (e.g., relative magnetic permeability (pr) values of 50,000 or more, such as 80,000 or more, such as from about 50,000 to about 110,000, such as from about 80,000 to about 100,000), and typically include one or more of nickel, iron, copper, chromium, molybdenum, or silicon. Illustrative, but non-limiting, examples of nonmagnetic materials that can be used for casing(s) 200 include metals, metal alloys (e.g., iron, steel, copper, brass, zinc, aluminum), a dielectric (e.g., ceramic, quartz, Rexolite™ (polystyrene with divinylbenzene), teflon (PTFE)), a semiconductor (e.g., silicon), or combinations thereof.

In some embodiments, the relative magnetic permeability of the material used to make the casing 200 ranges from $\mu_{r1}$ to $\mu_{r2}$, wherein $\mu_{r1}$ to $\mu_{r2}$ is, independently, e.g., about 50,000, about 51,000, about 52,000, about 53,000, about 54,000, about 55,000, about 56,000, about 57,000, about 58,000, about 59,000, about 60,000, about 61,000, about 62,000, about 63,000, about 64,000, about 65,000, about 66,000, about 67,000, about 68,000, about 69,000, about 70,000, about 71,000, about 72,000, about 73,000, about 74,000, about 75,000, about 76,000, about 77,000, about 78,000, about 79,000, about 80,000, about 81,000, about 82,000, about 83,000, about 84,000, about 85,000, about 86,000, about 87,000, about 88,000, about 89,000, about 90,000, about 91,000, about 92,000, about 93,000, about 94,000, about 95,000, about 96,000, about 97,000, about 98,000, about 99,000, or about 100,000, as long as $\mu_{r1} < \mu_{r2}$.

The thickness of the casing 200 can vary based on, e.g., the magnetic field strength and/or the magnetic permeability material in the casing. For example, if the magnetic permeability is relatively low, a thicker casing can be used. As another example, if the magnetic permeability is relatively high, a thinner casing can be used. In some embodiments, the thickness of the casing 200 ranges from about 50 mils to about 300 mils, such as from about 100 mils to about 200 mils, such as from about 125 mils to about 175 mils, such as from about 140 mils to about 160 mils. In at least one embodiment, the thickness of the casing 200 (in units of mils) ranges from thickness$_1$ to thickness$_2$, wherein thickness$_1$ to thickness$_2$ is, independently, e.g., about 50, about 55, about 60, about 65, about 70, about 75, about 80, about 85, about 90, about 95, about 100, about 105, about 110, about 115, about 120, about 125, about 130, about 135, about 140, about 145, about 150, about 155, about 160, about 165, about 170, about 175, about 180, about 185, about 190, about 195, or about 200, as long as thickness$_1$<thickness$_2$.

The casing 200 can take the shape of the magnet that it encapsulates/houses. Non-limiting examples for the shape of the casing 200 include, but are not limited to, a cylindrical, disc-shaped, bar-shaped, and so forth. In addition, the opening 202 can be of various sizes or shapes, including, but not limited to, square, rectangular, star, circular, elliptical, oval, or shapes with three or more sides, e.g., triangular, pentagonal, hexagonal, or octagonal. The opening 202 can be a slit a full opening of the entire face, a small opening (e.g., a small circular opening). As long as there is escaping of magnetic field through the opening 202, various sizes and/or shapes of the opening 202 can be utilized.

In FIG. 2B, although the opening 202 is shown to extend over two surfaces of the casing 200, the opening 202 can be over only one surface of the casing 200 or more than two surfaces of the casing 200. In addition, the casing 200 can have more than one opening 202.

Dimensions of the opening(s) 202 can be chosen based on, e.g., the size and shape of the magnet. In some embodiments, an area of the opening 202 is from about 30 mm$^2$ to about 250 mm$^2$, such as from about 50 mm$^2$ to about 200 mm$^2$, such as from about 75 mm$^2$ to about 175 mm$^2$, such as from about 100 mm$^2$ to about 150 mm$^2$. More than one opening 202 can be used. For example, an opening that exposes the side of the magnet can be between about 75 mm$^2$ and about 225 mm$^2$, such as from about 100 mm$^2$ to about 200 mm$^2$, such as from about 125 mm$^2$ to about 175 mm$^2$, and an opening that exposes the bottom and/or top of the magnet (e.g., the north or south pole of the magnet) can be from about 20 mm$^2$ to about 110 mm$^2$, such as from about 30 mm$^2$ to about 100 mm$^2$, such as from about 40 mm$^2$ to about 80 mm$^2$, such as from about 50 mm$^2$ to about 70 mm$^2$. In at least one embodiment, the opening that exposes the north or south pole of the magnet is from about 25 mm$^2$ to about 45 mm$^2$.

In at least one embodiment, a ratio of the area of the opening exposing a magnet face (e.g., the top or bottom face of the magnet that either has the north or south pole) to that magnet face is about ranges from about 15% to about 35%, such as from about 20% to about 30%.

FIG. 2I shows a perspective view of magnets 143 with individual casings 200 surrounding a single plasma chamber 210. The magnets 143 with individual casings 200 are placed around the plasma chamber 210 and can rotate around the plasma chamber 210.

A corresponding top view showing magnet polarities are shown in FIG. 2J. Reference numerals are omitted for clarity in FIG. 2I and FIG. 2J. In FIG. 2I, at least a portion of the openings 202 of the casings 200 face the interior of the plasma chamber 210. In FIG. 2J, a portion of the casings, e.g., casings 200a, having magnets disposed therein can be oriented such that magnetic north facing up, while another portion of the casings, e.g., casings 200b, having magnets disposed therein can be oriented such that magnetic north faces down. By utilizing the casings as described herein, the average ExB drift velocity is significantly improved over conventional chambers. For example, and in some embodiments, the average ExB drift velocity profiles of a single plasma chamber 210 having casings 200 around the magnets 143 is at least about 5 times higher than magnets without casings, such as about 10 times or more, such as about 20 times or more, such as about 30 times or more, such as about 35 times or more. In at least one embodiment, the average ExB drift velocity when using the casings is about 2×10$^7$ m/s or more, such as from about 2×10$^7$ m/s to about 100×10$^7$ m/s, such as from about 25×10$^7$ m/s to about 75×10$^7$ m/s, such as from about 40×10$^7$ m/s to about 60×10$^7$ m/s.

In some embodiments, casings 200 are used in systems 215 having two plasma chambers as shown in FIG. 2K. Chambers 220a, 220b can be, e.g., chambers 101a, 101b of system 100 (FIG. 1A). When two chambers are used, magnetic field cross-talk exists between the two chambers. Magnetic field cross-talk exists when magnets surrounding one chamber couple magnetic field not just to the chamber that the magnets surround but also to another chamber placed next to it. This magnetic field that is coupled from magnets surrounding one chamber to the other chamber placed adjacently is called the magnetic field cross-talk.

By utilizing the casings 200 to house magnets as described herein, the magnetic field cross-talk between the two chambers 220a, 220b is reduced relative to chambers that do not have casings housing magnets. The magnetic field cross-talk can be measured by average residual ExB drift velocity as a percentage of actual drift velocity. The lower the percentage, the lower the amount of magnetic field cross-talk. When using casings 200, the average ExB residual drift velocity as a percentage of the actual drift velocity is less than about 8.0%, such as less than about 7.8%, such as less than about 7.6%, such as less than about 7.4%, such as less than about 7.2%, such as less than about 7.0%, such as less than about 6.8%, such as less than about 6.6%, such as less than about 6.4%, such as less than about 6.2%, such as less than about 6.0%, such as less than about 5.8%, such as less than about 5.6%, such as less than about 5.4%, such as less than about 5.2%, such as less than about 5.0%, such as less than about 4.8%, such as less than about 4.6%, such as less than about 4.4%, such as less than about 4.2%, such as less than about 4.0%.

Caps

Embodiments of the present disclosure also generally relate to magnet holding structures, such as caps, that are used to hold one or more magnets with or without caps. The cap(s) can unite the magnetic field from the individual magnets that they hold and direct the united magnetic field towards the processing chamber. This can improve azimuthal uniformity of the magnetic field strength, especially near chamber walls that is caused by magnetic field arising from discrete magnets placed at discrete azimuthal positions around the chamber.

FIG. 3A is a perspective view of example cap(s) 301 according to at least one embodiment of the present disclosure. The plurality of magnets 143 is disposed between a top cap 301a and a bottom cap 301c (or top cap 301b and a bottom cap 301d) such that the cap(s) 301 (or piece(s)) can be located on both a top surface and a bottom surface of a plurality of magnets 143 (with or without casings 200). The cap(s) 301 are configured to receive one or more magnets 143, with or without casings 200. To hold the magnets 143 (with or without casings 200), the cap(s) 301 can have a plurality of magnet retention members 302, which can be in the form of, e.g., apertures, protrusions, indentations, cavities, holes, etc. The magnet retention member 302 is configured to facilitate retention of magnet 143, with or without casings 200, by preventing movement of the magnet/casing.

For example, the surfaces of the magnet retention member 302 can frictionally engage magnet 143 and/or casing 200 and prevent magnet 143 and/or casing 200 from moving radially and/or side-to-side.

Each of the cap(s) 301 (or piece(s)) is configured to fit around inner sidewall 109 such that the cap(s) 301 takes the shape of a ring having an outside diameter and an inside diameter. Alternatively, multiple caps 301 come together to form a ring. For example, and as shown in FIG. 3A, two top caps (e.g., top cap 301a and top cap 301b) can join to form a ring, each of the top caps 301a, 301b having an inner edge and an outer edge. More than two top caps can be joined to form the ring. Similarly two bottom caps (e.g., bottom cap 301c and bottom cap 301d) can join to form a ring, each of the bottom caps 301c, 301d having an inner edge and an outer edge. More than two bottom caps can be joined to form the ring. Although the shape of the cap(s) 301 is shown to fit a cylindrical chamber, it is contemplated that other shapes of the cap(s) 301 can be implemented based on the shape of, e.g., the chamber. The cap(s) 301 have tunable parameters that provide control over how much magnetic field is coupled into the chamber. The tunable parameters include, e.g., the magnetic permeability of the material used to make the cap(s), and/or the size and thickness of each cap.

In some embodiments, the cap(s) 301 can be made of a material that is magnetic, nonmagnetic, or combinations thereof. The material used to make cap(s) 301 typically has a relative magnetic permeability less than that of a casing. Non-limiting examples of materials that can be used for the cap(s) 301 include, but are not limited to, magnetic materials, nonmagnetic materials, or combinations thereof.

Illustrative, but non-limiting, examples of magnetic materials that can be used for cap(s) 301 include stainless steel, aluminum, zinc, magnesium manganese zinc ferrite, cobalt nickel zinc ferrite, Mo—Fe—Ni powder compound (e.g., molypermalloy powder (MPP)), nickel iron powder compound, Al—Si—Fe powder compound (e.g., sendust), iron powder compound, silicon iron powder compound, carbonyl iron powder compound, carbon steel, nickel, martensitic stainless steel (both hardened and annealed), or combinations thereof. Illustrative, but non-limiting, examples of nonmagnetic materials that can be used for cap(s) 301 include metals, metal alloys (e.g., iron, steel, copper, brass, zinc, aluminum), a dielectric (e.g., ceramic, quartz, Rexolite™ (polystyrene with divinylbenzene), teflon (PTFE)), a semiconductor (e.g., silicon), or combinations thereof.

In some embodiments, the relative magnetic permeability of the material used to make the cap(s) 301 is from about 10 to about 1000, such as from about 50 to about 800, such as from about 100 to about 500. In at least one embodiment, the relative magnetic permeability of the material used to make the cap(s) 301 ranges from $\mu_{r3}$ to $\mu_{r4}$, wherein $\mu_{r3}$ to $\mu_{r4}$ is, independently, e.g., about 0, about 10, about 50, about 100, about 150, about 200, about 250, about 300, about 350, about 400, about 450, about 500, about 550, about 600, about 650, about 700, about 750, about 800, about 850, about 900, about 950, or about 1000, as long as $\mu_{r3} < \mu_{r4}$.

The thickness of the cap(s) 301 can range from about 5 mm to about 30 mm, such as from about 10 mils to about 25 mm, such as from about 15 mm to about 20 mm. In at least one embodiment, the thickness of the casings (in units of mm) ranges from thickness$_1$ to thickness$_2$, wherein thickness$_3$ to thickness$_4$ is, independently, e.g., about 5, about 10, about 15, about 20, about 25, or about 30, as long as thickness$_3$ < thickness$_4$.

FIG. 3B is a perspective view of example cap(s) 301 surrounding a plasma chamber 310 according to at least one embodiment of the present disclosure. A corresponding top view showing magnet polarities is shown in FIG. 3C. Reference numerals are omitted for clarity in FIG. 3B and FIG. 3C. A plurality of magnets 143, which may be in a plurality of casings 200, surround the plasma chamber 310. The magnets 143 with caps 301 are placed around the plasma chamber 310 and can rotate around the plasma chamber 310. The plurality of magnets 143 (with or without casings 200) are disposed between a top cap 301b and a bottom cap 301d.

In FIG. 3B, at least a portion of the openings 202 of the casings 200 face the interior of the plasma chamber 310. As shown in FIG. 3C, at least a portion of the magnets 143, with or without casings 200, can be oriented such that the north pole of the magnet faces up, while another portion of the magnets 143, with or without casings 200, can be oriented such that north pole of the magnet faces down.

By utilizing the cap(s) 301 and casings 200 as described herein, the average E×B drift velocity is significantly improved over conventional chambers. For example, and in some embodiments, the average E×B drift velocity profiles of a single chamber having cap(s) 301 and casings 200 around the magnets 143 is at least about 5 times higher than magnets without caps and casings, such as about 10 times or more, such as about 100 times or more, such as about 1000 times or more. In at least one embodiment, the average E×B drift velocity when using the casings and caps is about $2 \times 10^7$ m/s or more, such as from about $2 \times 10^7$ m/s to about $2,000 \times 10^7$ m/s, such as from about $100 \times 10^7$ m/s to about $1,800 \times 10^7$ m/s, such as from about $500 \times 10^7$ m/s to about $1500 \times 10^7$ m/s.

In some embodiments, cap(s) 301 are used in systems 315 having two plasma chambers as shown in FIG. 3D. Chambers 320a, 320b can be, e.g., chambers 101a, 101b of system 100 (FIG. 1A).

By utilizing the cap(s) 301 and casings 200 to house magnets 143 as described herein, the magnetic field cross-talk between the chambers 320a, 320b is reduced relative to chambers that do not have caps and casings housing magnets. The magnetic field cross-talk can be measured by average residual E×B drift velocity as a percentage of actual drift velocity, and the lower the percentage, the lower the amount of magnetic field cross-talk. When using cap(s) 301 and casings 200, the average E×B residual drift velocity as a percentage of the actual drift velocity is less than about 6.0%, such as less than about 5.8%, such as less than about 5.6%, such as less than about 5.4%, such as less than about 5.2%, such as less than about 5.0%, such as less than about 4.8%, such as less than about 4.6%, such as less than about 4.4%, such as less than about 4.2%, such as less than about 4.0%, such as less than about 3.8%, such as less than about 3.6%, such as less than about 3.4%, such as less than about 3.2%, such as less than about 3.0%, such as less than about 2.8%, such as less than about 2.6%, such as less than about 2.4%, such as less than about 2.2%, such as less than about 2.0%.

The following illustrative, but non-limiting, examples are not intended to limit the scope of embodiments of the present disclosure.

EXAMPLES

In some examples, the magnetic-material casings are made of a metal material of about 100 mils thick, and a $\mu_r$ of about 80000. Uniting caps at the top and bottom of the magnets are made of stainless steel of about 5.8 mm thick and a $\mu_r$ of about 800. The 32 magnets are neodymium magnets whose magnetic field retention Br is 1.24 Tesla for each stack (e.g., magnetization of ~940 kA/m). The individual casings for the magnets have a 1 inch×0.2 inch opening slot in each magnet casing, where the slot faces the chamber and extends to the bottom of the magnet.

Table 1 shows the average E×B drift velocity and the magnetic field cross-talk of a comparative example (magnets without caps and casings), Ex. 1 (magnets with casings), and Ex. 2 (magnets with casings and caps). The average E×B drift velocity is inversely proportional to the magnetic field strength.

TABLE 1

|  | Comparative | Ex. 1 | Ex. 2 |
|---|---|---|---|
| Average E × B drift velocity, ×10$^7$ m/s | 1.38 | 51.7 | 1,530 |
| Magnetic field cross-talk between two chambers | 7.86% | 6.62% | 5.14% |

The results show that adding the casings increases the average E×B drift velocity inside the chamber by about 37.5 times that of the comparative, while adding the casings and caps increases the average E×B drift velocity inside the chamber by about 1107 times that of the comparative. The magnetic field cross-talk between two chambers is reduced by adding the individual casings. The magnetic field cross-talk, presented as a percentage of actual drift velocity, for Ex. 1 is about 6.62% which is smaller than the 7.86% of the comparative example, having no magnetic material casings. The magnetic field cross-talk between two chambers is further reduced by adding the individual casings and caps, where Ex. 2 has a magnetic field cross-talk of about 5.14% which is smaller than the 7.86% of the comparative example, having no casings or caps. The stainless steel caps also have a high enough permeability to unite the fields emanating from the magnets that each cap holds and directing the united field towards plasma chambers. The spatial footprint of the casings and stainless caps is much smaller than a conventional chamber encapsulating magnetic-material shields or chamber-sized magnetic material walls that can also reduce cross-talk between two sides/chambers.

Overall, embodiments described herein provide magnet holding structures, e.g., casings and caps, which can be utilized with magnets during plasma processing of a substrate. The casings and/or caps enable, e.g., attenuation of the magnetic-field strength around the magnets. Use of the casings and/or caps improve the average different velocity and decrease the amount of magnetic field cross-talk between two or more chambers.

As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa. The term "coupled" is used herein to refer to elements that are either directly connected or connected through one or more intervening elements.

For the purposes of this disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

While the foregoing is directed to examples of the present disclosure, other and further examples of the disclosure may be devised without departing from the basic scope thereof, and the scope thereof is determined by the claims that follow.

What is claimed is:

1. A chamber for processing a substrate, comprising:
   a chamber body;
   a rotational magnetic housing system having a rotational magnetic housing coupled to the chamber, the rotational magnetic housing comprising:
      an upper plate;
      an outer sidewall;
      an inner sidewall defining a round central opening;
      a lower plate; and
      a plurality of retaining brackets disposed in the rotational magnetic housing; and
   a magnet holding structure comprising:
      a plurality of casings, wherein each casing of the plurality of casings is configured to at least partially encapsulate a magnet; and
      a plurality of caps comprising at least one top cap and at least one bottom cap, each top cap and each bottom cap having a plurality of retention features configured to retain multiple casings of the plurality of casings, wherein the plurality of casings are disposed between the at least one top cap and the at least one bottom cap,
   wherein the plurality of retaining brackets have the plurality of casings removably disposed therein, and
   wherein each casing of the plurality of casings is retained in a respective retaining bracket with a pitch p between each casing of the plurality of magnets.

2. The chamber of claim 1, wherein one or more casings of the plurality of casings is made of a material having a relative magnetic permeability value of 50,000 or greater.

3. The chamber of claim 1, wherein the plurality of caps comprises:
   a top cap having a plurality of magnet retention members, the top cap having a first inside edge and a first outside edge; and
   a bottom cap having a plurality of magnet retention members, the bottom cap having a second inside edge and a second outside edge, wherein each casing positioned between a magnet retention member of the top cap and a magnet retention member of the bottom cap.

4. The chamber of claim 3, wherein the top cap and the bottom cap are made of a material comprising steel, copper, brass, zinc, aluminum, magnesium, iron, manganese, nickel, ceramic, quartz, polystyrene, divinylbenzene, silicon, polytetrafluoroethylene, or combinations thereof.

5. The chamber of claim 3, wherein the top cap and the bottom cap are made of a material comprising stainless steel, and one or more casings of the plurality of casings is made of a material having a relative magnetic permeability value of about 80,000 to about 100,000.

6. The chamber of claim 1, wherein:
each retaining bracket of the plurality of retaining brackets is disposed in the rotational magnetic housing with a distance d between each retaining bracket; and
the plurality of magnets are configured to travel in a circular path when the rotational magnetic housing is rotated around the round central opening.

7. The chamber of claim 5, wherein one or more casings of the plurality of casings is made of a material comprising nickel, iron, copper, chromium, molybdenum, silicon, or combinations thereof.

8. The chamber of claim 1, wherein one or more casings of the plurality of casings has an opening, and wherein at least a portion of each opening is configured to face the chamber.

9. The chamber of claim 1, wherein a thickness of one or more casings of the plurality of casings is from about 100 mils to about 200 mils.

10. The chamber of claim 1, wherein one or more caps of the plurality of caps is made of a material having a relative magnetic permeability value from about 10 to about 1000.

\* \* \* \* \*